(12) United States Patent
Denison et al.

(10) Patent No.: US 8,581,660 B1
(45) Date of Patent: Nov. 12, 2013

(54) POWER TRANSISTOR PARTIAL CURRENT SENSING FOR HIGH PRECISION APPLICATIONS

(75) Inventors: Marie Denison, Plano, TX (US); Ubol Udompanyavit, Dallas, TX (US); Osvaldo Jorge Lopez, Annandale, NJ (US); Joseph Maurice Khayat, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 32 days.

(21) Appl. No.: 13/454,730

(22) Filed: Apr. 24, 2012

(51) Int. Cl.
*H01L 25/00* (2006.01)

(52) U.S. Cl.
USPC ............................ 327/565; 327/566; 327/577

(58) Field of Classification Search
USPC ......... 327/534, 543, 545, 546, 564, 565, 566, 327/574, 577, 578, 581
See application file for complete search history.

(56) References Cited

U.S. PATENT DOCUMENTS

| | | | | |
|---|---|---|---|---|
| 5,061,863 A | * | 10/1991 | Mori et al. | 327/50 |
| 5,281,872 A | * | 1/1994 | Mori | 327/362 |
| 6,369,646 B1 | * | 4/2002 | Kesler et al. | 327/564 |

* cited by examiner

*Primary Examiner* — Jeffrey Zweizig
(74) *Attorney, Agent, or Firm* — Steven A. Shaw; W. James Brady; Frederick J. Telecky, Jr.

(57) ABSTRACT

A power transistor module including a power transistor with a first common power node, and a split control node. A first clip is connected to a portion of a second power node so that current through a first control segment of the control node is directed through a first transistor portion and through the first clip. A second clip is connected to another portion of the second power node so that current through a second control segment is directed through a second transistor portion and through the second clip. A ratio of an area of the first transistor portion to a combined area of the first and second portions is 5 percent to 75 percent. A shunt is coupled in series to the first clip. The shunt may be directly electrically connected to the first portion of the power transistor.

20 Claims, 9 Drawing Sheets

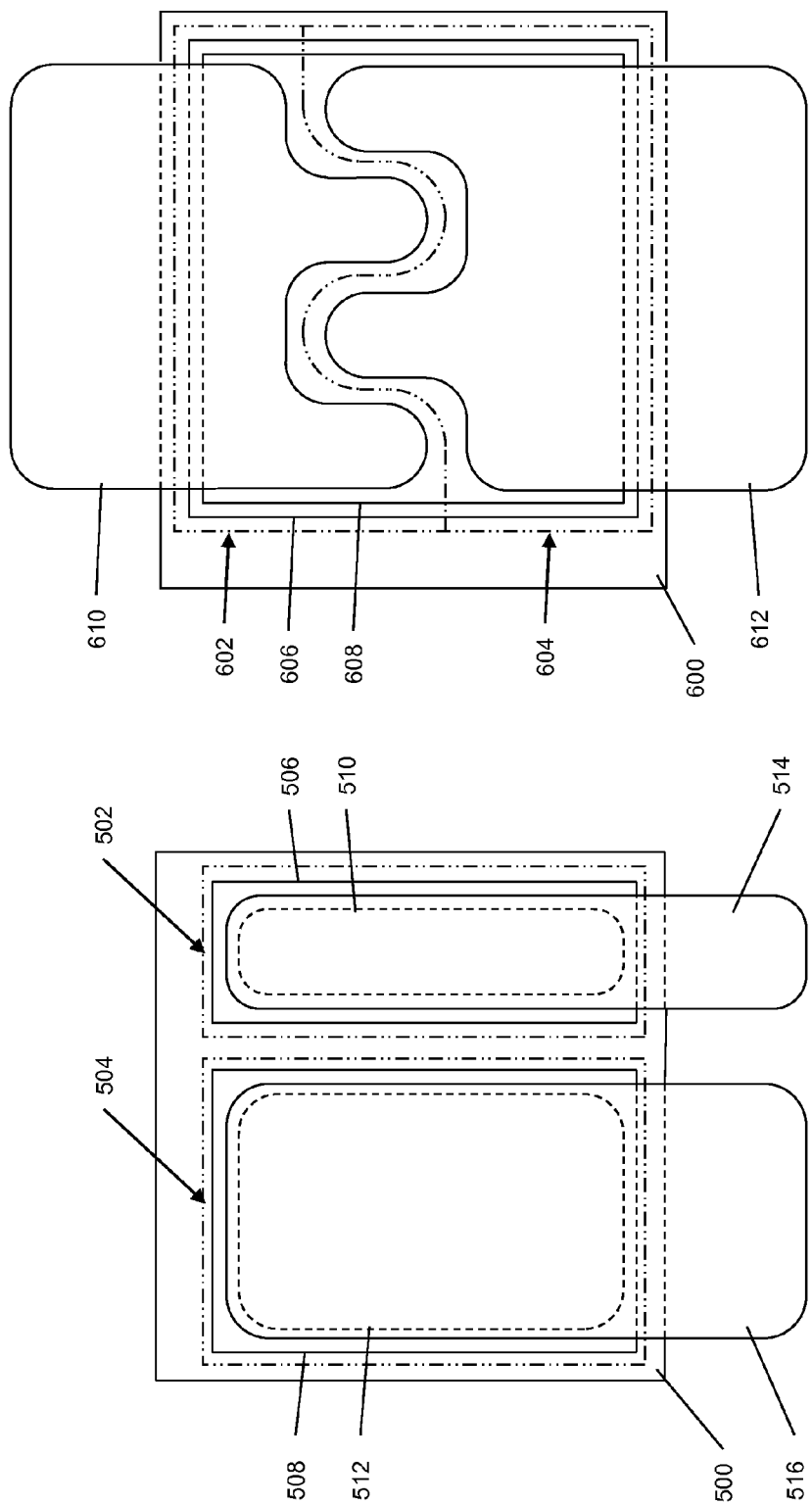

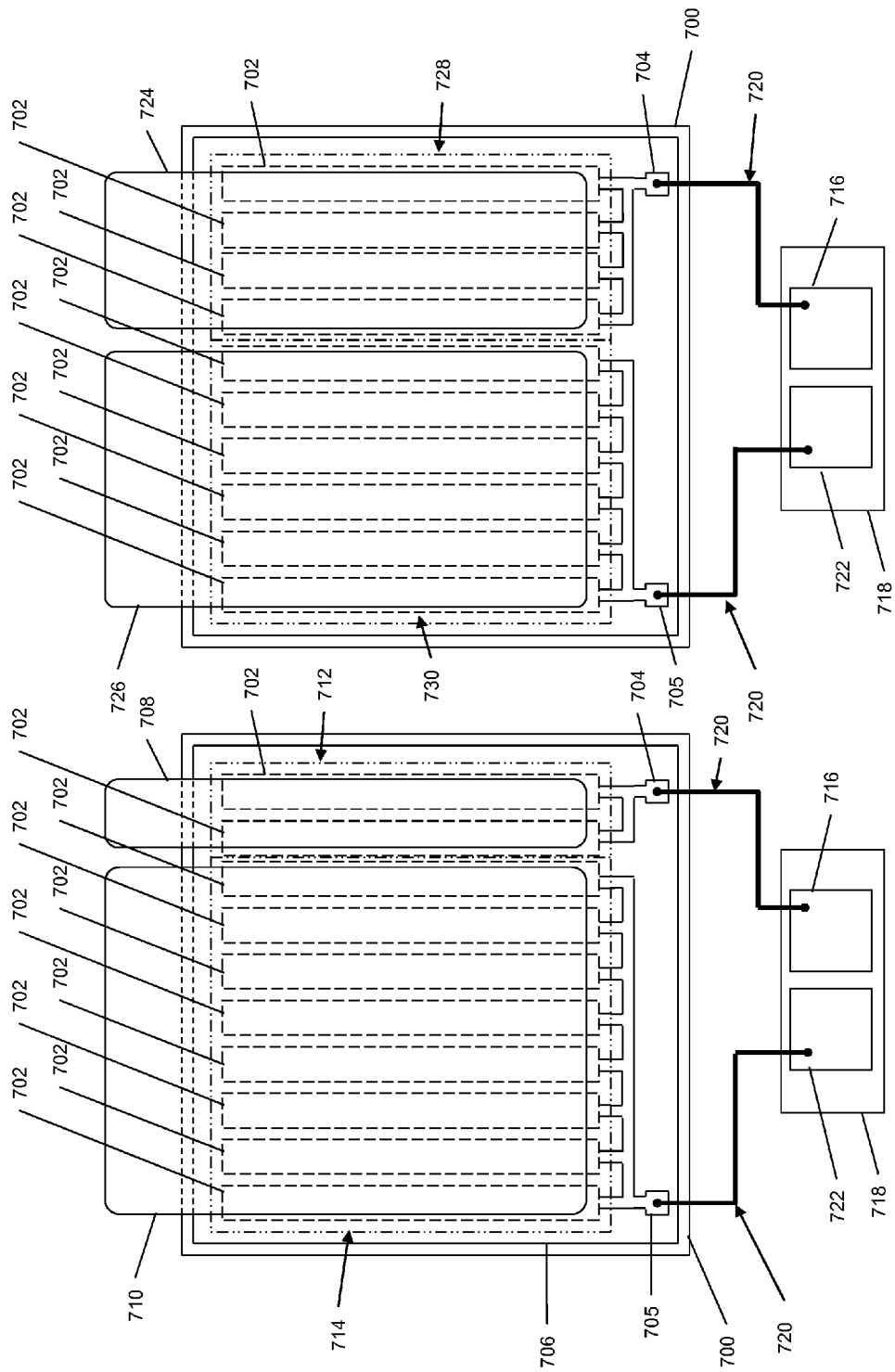

POWER TRANSISTOR PARTIAL CURRENT SENSING FOR HIGH PRECISION APPLICATIONS

FIELD

Embodiments of the invention relate to the field of power transistors modules.

BACKGROUND

Power transistor modules may be used in switching mode to supply modulated current, for example in buck converter power supplies. It may be desirable to accurately measure the current in the power transistors while minimizing power consumption of the power transistor modules.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A power transistor module may include a power transistor with a common power node, such as a drain or source node for a metal oxide semiconductor (MOS) power transistor or a collector or emitter node for a bipolar power transistor, and a split control node, such as gate node for the MOS power transistor or a base node for the bipolar power transistor. A first segment of the control node modulates current through a first portion of the power transistor, and a second segment of the control node modulates current through a second portion of the power transistor. A first power module interconnect element, referred to as a first clip, is connected to the opposite power node of the power transistor, which is the source or drain node, respectively, for the MOS power transistor or the emitter or collector node, respectively, for the bipolar power transistor, so that current through the first portion of the power transistor is directed through the first clip. A second clip is connected to the opposite power node of the power transistor so that current through the second portion of the power transistor is directed through the second clip. The split control node and first and second clips are configured so that a ratio of an area of the first portion of the power transistor to an area of the second portion of the power transistor is 5 percent to 75 percent. A current sense resistor, referred to as a shunt, is coupled in series to the first clip. A voltage drop across the shunt is used to estimate current through the first portion of the power transistor. In an alternate version, the shunt may be directly electrically connected to the first portion of the power transistor.

DESCRIPTION OF THE VIEWS OF THE DRAWING

FIG. 5 and FIG. 6 depict alternate embodiments of power transistors.

FIG. 7A and FIG. 7B depict instances of a power transistor formed according to an embodiment in power transistor modules with different clip configurations.

DETAILED DESCRIPTION OF EXAMPLE EMBODIMENTS

Figure 1:
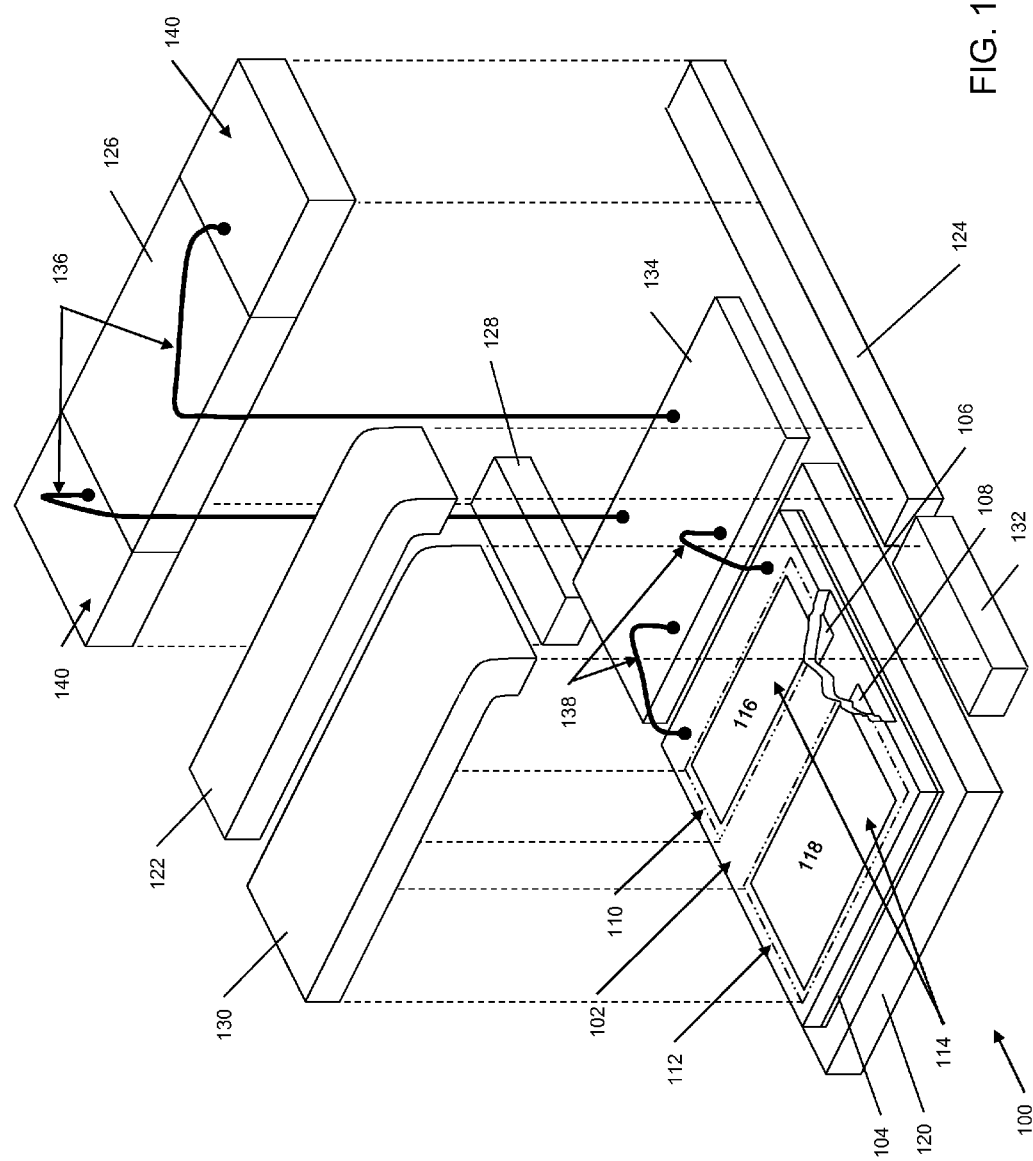
FIG. 1 is a perspective view of a power transistor module formed according to an embodiment.

The invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

A power transistor module may include a power transistor with a common power node, such as a drain or source node for an MOS power transistor or a collector or emitter node for a bipolar power transistor, and a split control node, such as gate node for the MOS power transistor or a base node for the bipolar power transistor. A first segment of the control node modulates current through a first portion of the power transistor, and a second segment of the control node modulates current through a second portion of the power transistor. A first power module interconnect element, referred to as a first clip, is connected to an opposite power node of the power transistor, which is a source or drain node, respectively, for the MOS power transistor or a emitter or collector node, respectively, for the bipolar power transistor, so that current through the first portion of the power transistor is directed through the first clip. A second clip is connected to the opposite power node of the power transistor so that current through the second portion of the power transistor is directed through the second clip. The split control node and first and second clips are configured so that a ratio of an area of the first portion of the power transistor to a combined area of the first and second portions of the power transistor is 5 percent to 75 percent. A current sense resistor, referred to as a shunt, is coupled in series to the first clip. In an alternate version, the shunt may be directly electrically connected to the first portion of the power transistor. A voltage drop across the shunt is used to estimate current through the first portion of the power transistor. An optional bias compensation circuit may provide a compensated bias to the first control node segment of the power transistor to compensate for the voltage drop across the shunt.

For the purposes of this Description, the term "clip" will be understood to refer to a preformed electrically conductive interconnect of a power transistor module which is attached to a power transistor after the power transistor is singulated from a semiconductor substrate containing other instances of power transistors. Interconnect elements which are formed as part of the power transistor fabrication sequence preceding singulation are not considered to be clips.

FIG. 1 is a perspective view of a power transistor module formed according to an embodiment. The power transistor module 100 includes a power transistor 102 which may be, for example, an MOS power transistor or a bipolar junction transistor. For the purpose of improving the readability of this Description, embodiments will be described for MOS power transistors. It will be recognized that bipolar power transistors may be used in the embodiments in place of the MOS power transistors. The power transistor 102 has a common first power node 104, which may be a drain node in one version of the embodiment or a source node in another version. The power transistor 102 has a split control node with a first control segment 106 and a second control segment 108. In the version of the embodiment in which the power transistor 102 is an MOS transistor, the split control node is a split gate node, the first control segment 106 is a first gate segment 106 and the second control segment 108 is a second gate segment 108. The first gate segment 106 modulates current through a first portion 110 of the power transistor 102, and the second gate segment 108 modulates current through a second portion 112 of the power transistor 102.

A second power node 114 of the power transistor 102 is a source node in a version of the embodiment in which the first power node 104 is the drain node, and is a drain node in a version in which the first power node 104 is the source node. In one version of the embodiment, the second power node 114 may be common to the first portion 110 and the second portion 112 of the power transistor 102. In another version, depicted in FIG. 1, the second power node 114 may be split into two segments. In such a version, a first segment 116 of the second power node 114 would be part of the first portion 110 of the power transistor 102 and would be aligned with the first gate segment 106 so that current modulated by the first gate segment 106 is directed through the first segment 116 of the second power node 114. Similarly, a second segment 118 of the second power node 114 would be part of the second portion 112 of the power transistor 102 and would be aligned with the second gate segment 108 so that current modulated by the second gate segment 108 is directed through the second segment 118 of the second power node 114. A ratio of an area of the first transistor portion 110 to a combined area of the first transistor portion 110 and the second transistor portion 112 is 5 percent to 75 percent. In one version of the embodiment, the power transistor 102 may be a vertical MOS transistor. In an alternate version, the power transistor 102 may be a planar MOS transistor. In another version, the power transistor 102 may be a bipolar transistor 102, the first power node 104 may be a collector node or an emitter node, the second power node 114 may be an emitter node or a collector node, respectively, the split control node may be a base node, the first control segment 106 may be a first base segment 106, and the second control segment 108 may be a second base segment 108. In a further version, the power transistor 102 may be an insulated gate bipolar transistor (IGBT). In one version, the power transistor 102 may be formed on single crystal silicon. In another version, the power transistor 102 may be formed on gallium nitride, for example on a gallium nitride epitaxial layer disposed over a single crystal silicon Substrate.

The first power node 104 may be attached and electrically connected to an electrically conductive transistor pad 120 such as a plated copper pad, for example using an electrically conductive adhesive. A first clip 122 is electrically connected to the second power node 114 over the first portion 110 of the power transistor 102, and specifically to the first segment 116 of the second power node 114 if present. In the embodiment, the first clip 122 may be electrically connected to a first module pad 124 of the power transistor module 100, and a shunt 126 is electrically connected to the first module pad 124 in series with the first transistor portion 110. A second module pad 128 may be electrically connected to the shunt 126 to form a first electrically connected path including, in order, the transistor pad 120, the first transistor portion 110, the first clip 122, the first module pad 124, the shunt 126 and the second module pad 128.

A second clip 130 is electrically connected to the second power node 114 over the second portion 112 of the power transistor 102, and specifically to the second segment 118 of the second power node 114 if present, and may be electrically connected to a third module pad 132, to form a second electrically connected path including, in order, the transistor pad 120, the second transistor portion 112, the second clip 130 and the third module pad 132. The first clip 122 and the second clip 130 may be electrically connected to the power transistor 102 using, for example, solder or an electrically conductive adhesive. The shunt 126 may be electrically connected to the first module pad 124 and the second module pad 128 using a same connection process as the first clip 122 and the second clip 130. The first clip 122, the second clip 130 and the shunt 126 may be electrically connected concurrently.

During operation of the power transistor module 100 a voltage drop across the shunt 126 is measured to estimate a current through the first transistor portion 110, for example by dividing the voltage drop by a resistance of the shunt 126. A total current through the power transistor 102 may be estimated by scaling the estimated first portion current by a ratio of the combined area of the first transistor portion 110 and the second transistor portion 112 to the area of the first transistor portion 110. Forming the power transistor 102 so that the ratio of the area of the first transistor portion 110 to a combined area of the first transistor portion 110 and the second transistor portion 112 is 5 percent to 75 percent may provide a desired accuracy of the estimated total current while maintaining a total power consumed by the power transistor module 100 within a desired limit.

The power transistor module 100 may further include an optional controller 134 which may be connected to measurement sites on the shunt 126 by shunt monitor links 136. The shunt monitor links 136 may be, for example, wire bonds. The controller 134 may estimate the current through the first transistor portion 110, and may also estimate the total current through power transistor 102. The controller 134 may provide bias voltages to the first gate segment 106 and the second gate segment 108 through gate bias links 138. The gate bias links 138 may be, for example, wire bonds, and may be formed concurrently with the shunt monitor links 136.

In one version of the embodiment, the shunt 126 may be a strip of metal including manganin or other metal with a temperature coefficient of resistivity below $1 \times 10^{-4}$ $K^{-1}$. The shunt 126 may have plated head regions 140 to provide desired electrical connections to the first module pad 124 and the second module pad 128. In another version of the embodiment, the shunt 126 may be a transistor of a same type as the power transistor 102, so as to match a temperature coefficient of resistivity of the power transistor 102. for example, if the power transistor 102 is an n-channel MOS transistor formed on gallium nitride, the shunt may also be an n-channel MOS transistor formed on gallium nitride.

The power transistor module 100 may further include a package, not shown, such as a molded plastic encapsulation or a substrate and potting compound cover. The package may include leads or may be leadless. Multiple instances of the power transistor module 100 may be formed concurrently using leadframes with multiple instances of the first clip 122 and the second clip 130 and possibly the shunt 126. The power transistor modules 100 may subsequently singulated after the power transistor module instances 100 are encapsulated.

Figure 2:
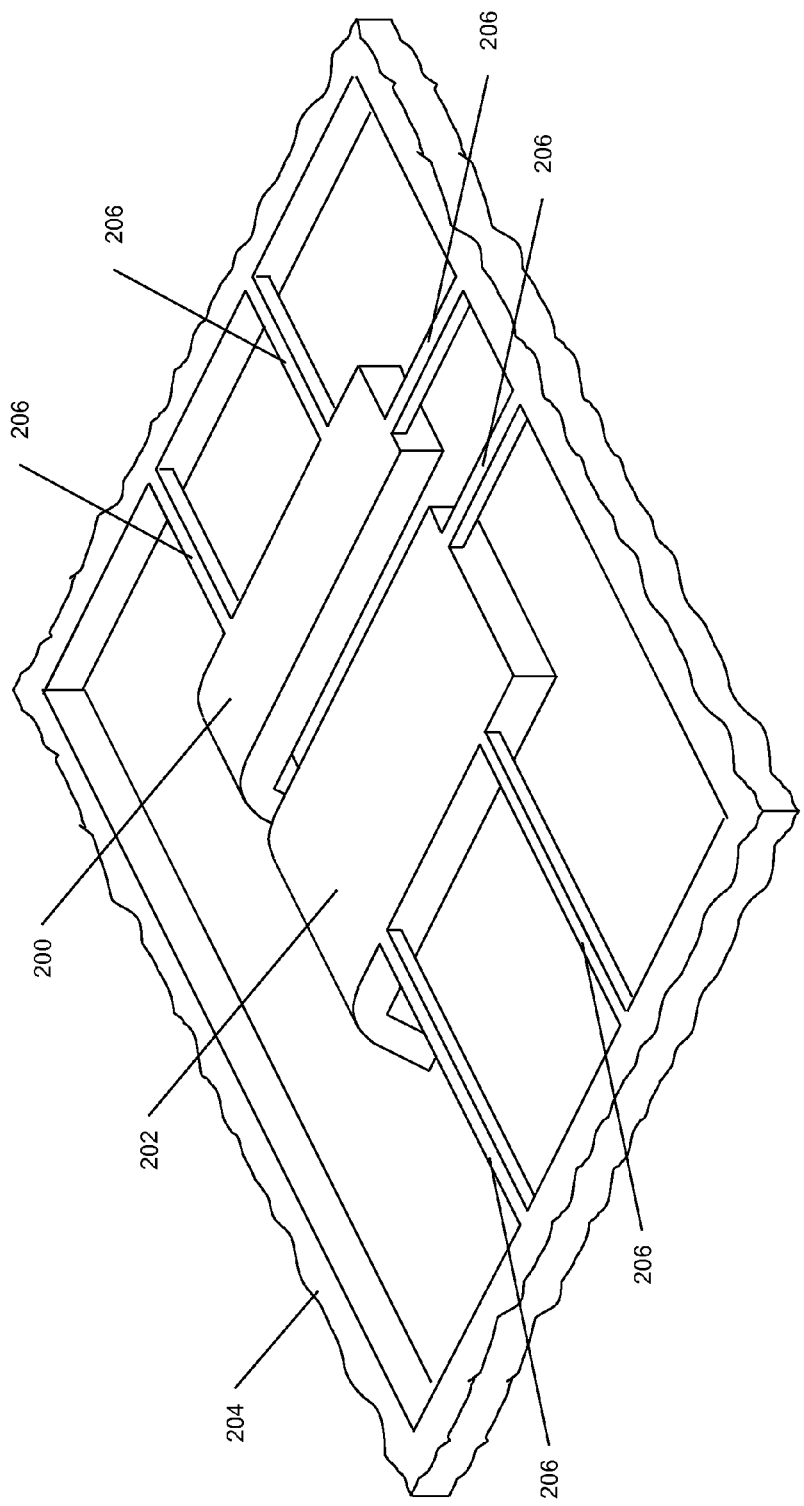
FIG. 2 depicts a first and second clip in a clip array which may be used in fabrication of a power transistor module according to an embodiment of the invention.

FIG. 2 depicts a first and second clip in a clip array which may be used in fabrication of a power transistor module according to the invention. The first clip 200 and the second clip 202 are attached to a frame 204 by tiebars 206. The frame may include multiple instances of the first clip 200 and the second clip 202 held in place by corresponding instances of the tiebars 206. The tiebars 206 hold the first clip 200 and the second clip 202 in a desired configuration as the first clip 200 and the second clip 202 are attached to a power transistor. Fabrication of the power transistor module containing the first clip 200, the second clip 202 and the power transistor may possibly include an encapsulation operation which surrounds the first clip 200, the second clip 202 and the power transistor with an encapsulation compound such as epoxy. After encapsulation, the power transistor module may be singulated from the frame 204, for example by sawing, which severs the tiebars 206, separating the first clip 200 and the second clip 202 from the frame 204.

Figure 3:
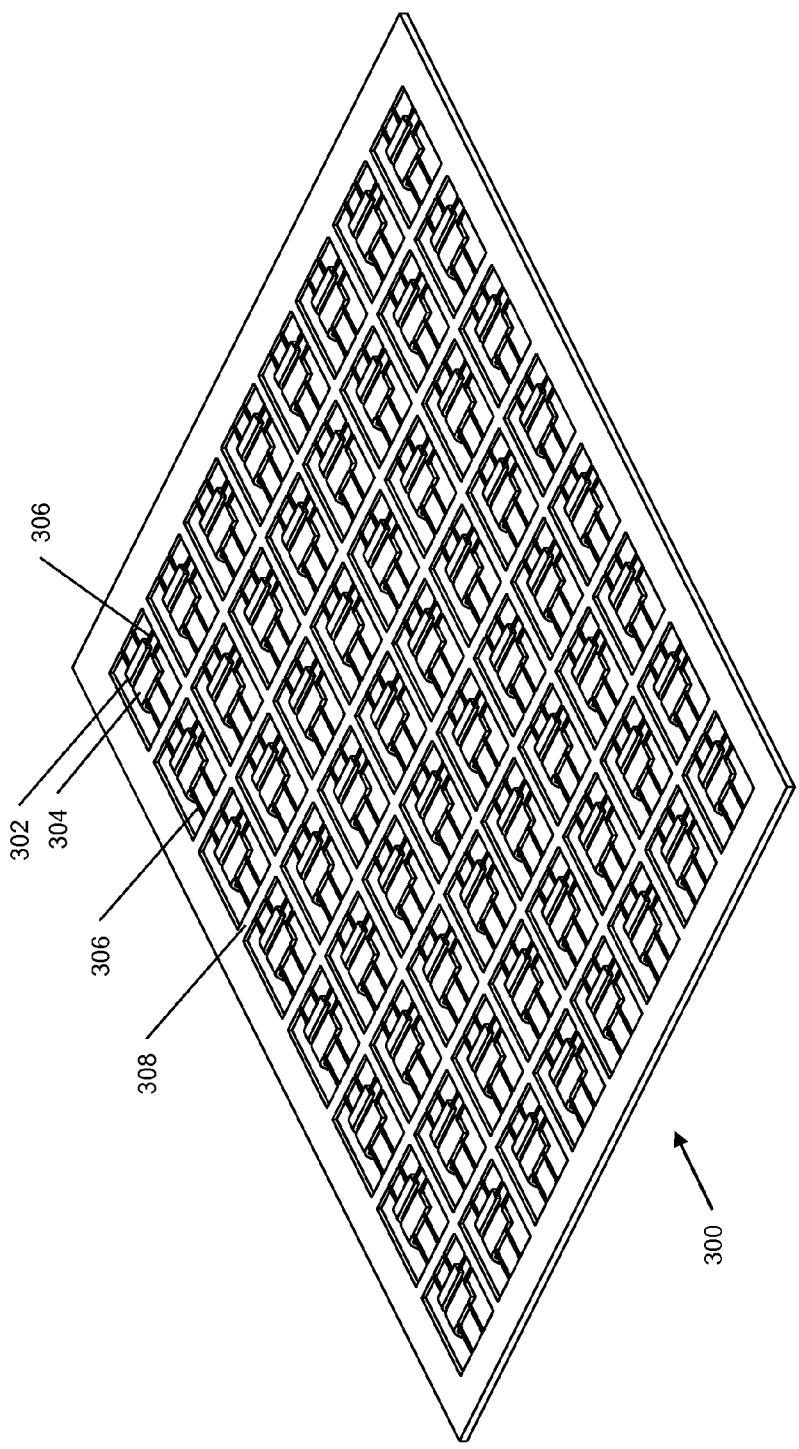
FIG. 3 depicts an array of instances of a first clip and a second clip in a clip array.

FIG. 3 depicts an array of instances of a first clip and a second clip in a clip array. The clip array 300 multiple instances of a first clip 302 and a second clip 304 attached by tiebars 306 to a frame 308, as described in reference to FIG. 2. Fabricating a plurality of power transistor modules concurrently using the clip array 300 may advantageously reduce a cost of each power transistor module.

Figure 4:
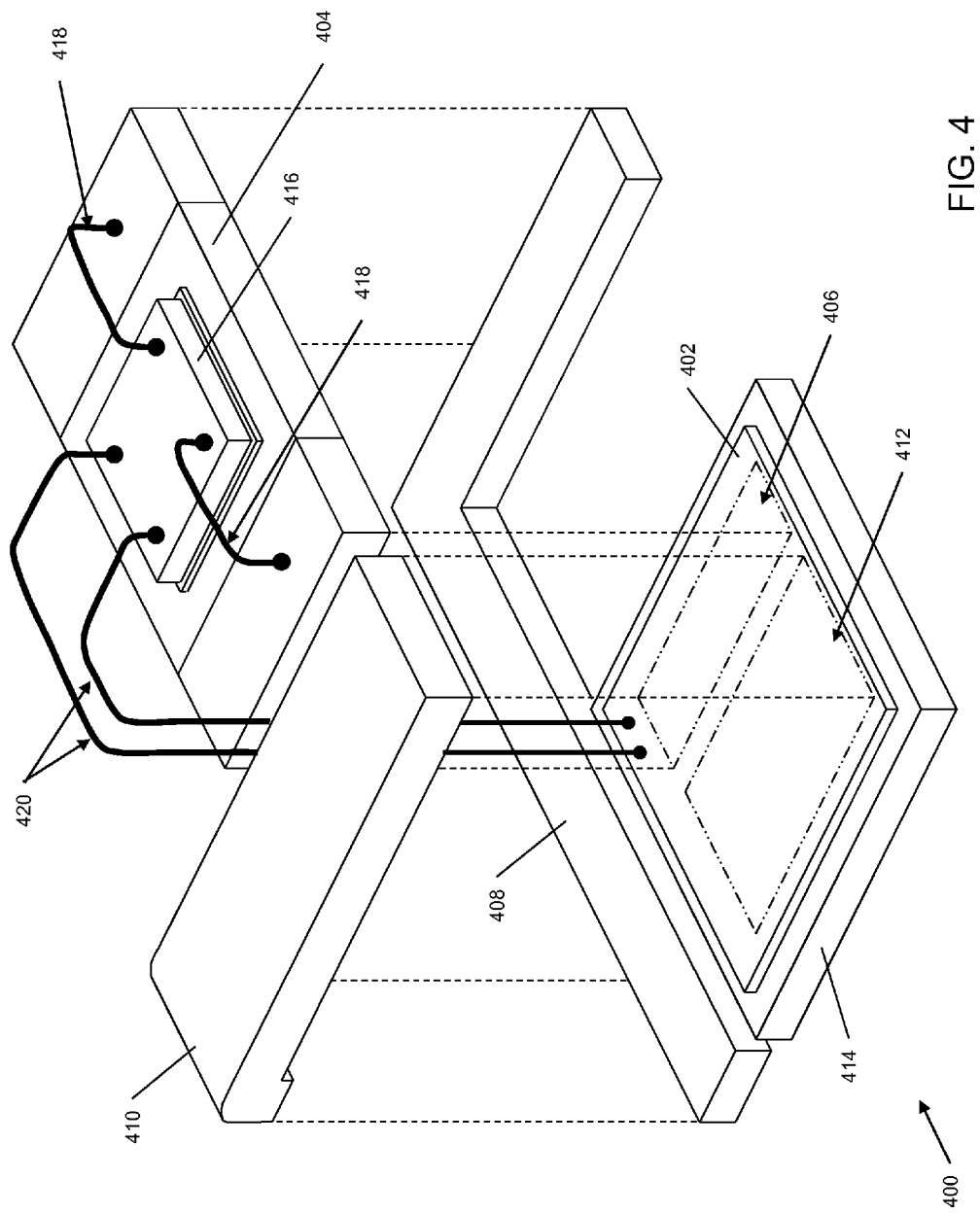
FIG. 4 is a perspective view of a power transistor module formed according to an alternate embodiment.

FIG. 4 is a perspective view of a power transistor module formed according to an alternate embodiment. The power transistor module 400 includes a power transistor 402 as described in reference to FIG. 1. A shunt 404 is electrically connected to a first portion 406 of the power transistor 402. The shunt 404 is further electrically connected to a module bus 408. A clip 410 is electrically connected to a second portion 412 of the power transistor 402 and to the module bus 408. A transistor pad 414 may be electrically connected to a common first power node of the power transistor 402 as described in reference to FIG. 1. A first electrically connected path of the power transistor module 400 includes, in order, the transistor pad 414, the first transistor portion 406, the shunt 404 and the module bus 408. A second electrically connected path includes, in order, the transistor pad 414, the second transistor portion 412, the clip 410 and the module bus 408. Forming the power transistor module 400 so that the shunt 404 is electrically connected to the first transistor portion 406 may advantageously provide a reduced size of the power transistor module 400.

The power transistor module 400 may further include an optional controller 416, as described in reference to FIG. 1, possibly disposed on the shunt 404 so as to advantageously reduce a size of the power transistor module 400. The controller 416 may be electrically connected to the shunt 404 through shunt monitor links 418 and may be electrically connected to the gate bondpads of the power transistor 402 through gate bias links 420. In another version of the embodiment, the controller 416 may be disposed adjacent to the power transistor 402 as described in reference to FIG. 1. In an alternate version of the embodiment, the controller 416 may be disposed outside of the power transistor module 400, for example on a circuit board on which the power transistor module 400 is mounted.

FIG. 5 and FIG. 6 depict alternate embodiments of power transistors. Referring to FIG. 5, the power transistor 500 has first transistor portion 502 and a second transistor portion 504. The power transistor 500 has a first power node, not shown, which is common to the first transistor portion 502 and the second transistor portion 504, as described in reference to FIG. 1. The power transistor 500 has a split gate with a first gate segment, not shown, and a second gate segment, not shown. The first gate segment modulates current through the first transistor portion 502, and the second gate segment modulates current through the second transistor portion 504, as described in reference to FIG. 1. The power transistor 500 further includes a second power node which is split into a first power node segment 506 within the first transistor portion 502 and a second power node segment 508 within the second transistor portion 504. The power transistor 500 is formed so that the current modulated by the first gate segment flows through the first power node segment 506, and the current modulated by the second gate segment flows through the second power node segment 508. The first power node segment 506 has a first metallization structure 510 within the first transistor portion 502 formed so that the current through the first power node segment 506 flows through the first metallization structure 510. Similarly, the second power node segment 508 has a second metallization structure 512 within the second transistor portion 504 formed so that the current through the second power node segment 508 flows through the second metallization structure 512. The first metallization structure 510 is physically separate from the second metallization structure 512. A first clip 514, as described in reference to FIG. 1, is electrically connected to the first metallization structure 510 and a second clip 516, as described in reference to FIG. 1, is electrically connected to the second metallization structure 512. In an alternate version of the embodiment, a shunt 514 may be electrically connected to the first metallization structure 510 rather than a clip.

Referring to FIG. 6, the power transistor 600 has first transistor portion 602 and a second transistor portion 604. The power transistor 600 has a first power node, not shown, which is common to the first transistor portion 602 and the second transistor portion 604, as described in reference to FIG. 1. The power transistor 600 has a split gate with a first gate segment, not shown, and a second gate segment, not shown. The first gate segment modulates current through the first transistor portion 602, and the second gate segment modulates current through the second transistor portion 604, as described in reference to FIG. 1. The power transistor 600 further includes a second power node 606 which extends into the first transistor portion 602 and the second transistor portion 604. The second power node 606 has a metallization structure 608 which extends into the first transistor portion 602 and the second transistor portion 604. A first clip 610 is electrically attached to the metallization structure 608 in the first transistor portion 602 and a second clip 612 is electrically attached to the metallization structure 608 in the second transistor portion 604. Current modulated by the first gate segment flows through the first clip 610 and current modulated by the second gate flows through the second clip 612. A ratio of an area of the first transistor portion 602 to a combined area of the first transistor portion 602 and the second transistor portion 604 is 5 percent to 75 percent. Forming the power transistor 600 to have a metallization structure 608 which extends into the first transistor portion 602 and the second transistor portion 604 may advantageously allow a second instance of the power transistor 600 to be used with a different configuration of clips to provide a different area ratio.

FIG. 7A and FIG. 7B depict instances of a power transistor formed according to an embodiment in power transistor modules with different clip configurations. The power transistor 700 has a common first power node, not shown, and a gate which includes a plurality of separate gate elements 702. The power transistor 700 has a common second power node 706. Current modulated by each of the gate elements 702 flows through the common first power node and through the common second power node 706.

Referring to FIG. 7A, a first instance of a first clip 708 is electrically attached to the second power node 706 over a first subset of the gate elements 702 of a first instance of the power transistor 700, so that current modulated by the gate elements 702 under the first clip 708 flows through the first clip 708. A first instance of a shunt, not shown, is electrically attached to the first clip 708 so that the current from the power transistor 700 flowing through the first clip 708 flows through the first instance of the shunt. A first instance of a second clip 710 is electrically connected to the second power node 706 over a second subset of the gate elements 702, so that current modulated by the gate elements 702 under the second clip 710 flows through the second clip 710. The gate elements 702 under the first clip 708 control current through a first portion 712 of the first instance of the power transistor 700. The gate elements 702 under the second clip 710 control current through a second portion 714 of the first instance of the power transistor 700. A ratio of an area of the first transistor portion 712 to a combined area of the first transistor portion 712 and the second transistor portion 714 is 5 percent to 75 percent. The gate elements 702 under the first clip 708 are electrically connected together and form a first gate segment. For example, the gate elements 702 under the first clip 708 may be electrically connected through a first interconnect element of the power transistor 700 to a first bondpad 704 on the power transistor 700 and wirebonded 720 to a first control circuit 716 of a first instance of a controller 718. Similarly, the gate elements 702 under the second clip 710 are electrically connected together and form a second gate segment. For example, the gate elements 702 under the second clip 710 may be electrically connected through a second interconnect element of the power transistor 700 to a second bondpad 705 on the power transistor 700 and wirebonded 720 to a second control circuit 722 of the first instance of the controller 718. The first and second interconnects may be formed during a last step of fabricating the power transistor 700.

Referring to FIG. 7B, a second instance of a first clip 724 is electrically attached to the second power node 706 over a first subset of the gate elements 702 of a second instance of the power transistor 700, so that current modulated by the gate elements 702 under the first clip 724 flows through the first clip 724. A second instance of the shunt, not shown, is electrically attached to the first clip 724 so that the current from the power transistor 700 flowing through the first clip 724 flows through the second instance of the shunt. A second instance of a second clip 726 is electrically connected to the second power node 706 over a second subset of the gate elements 702, so that current modulated by the gate elements 702 under the second clip 726 flows through the second clip 726. The gate elements 702 under the first clip 724 control current through a first portion 728 of the second instance of the power transistor 700. The gate elements 702 under the second clip 726 control current through a second portion 730 of the second instance of the power transistor 700. A ratio of an area of the first transistor portion 728 to a combined area of the first transistor portion 728 and the second transistor portion 730 is 5 percent to 75 percent. The gate elements 702 under the first clip 724 are electrically connected together, for example, to the first bondpad 704 and wirebonded 720 to the first control circuit 716 of a second instance of the controller 718. Similarly, the gate elements 702 under the second clip 726 are electrically connected together, for example to the second bondpad 705 and wirebonded 720 to the second control circuit 722 of the second instance of the controller 718.

A number of gate elements 702 under the first instance of the first clip 708 may be different than a number of the gate elements 702 under the second instance of the first clip 724. Forming the power transistor 700 to have a plurality of gate elements 702 which may be connected to separate bondpads through the first and second interconnects may advantageously allow the power transistor 700 to be used in different clip configurations by forming different configurations of the first and second interconnects. In either of the embodiments depicted in FIG. 7A and FIG. 7B, the shunt may be directly electrically attached to the power transistor 700 in place of the first clip 708 and/or 724, as described in reference to FIG. 4.

Figure 8:
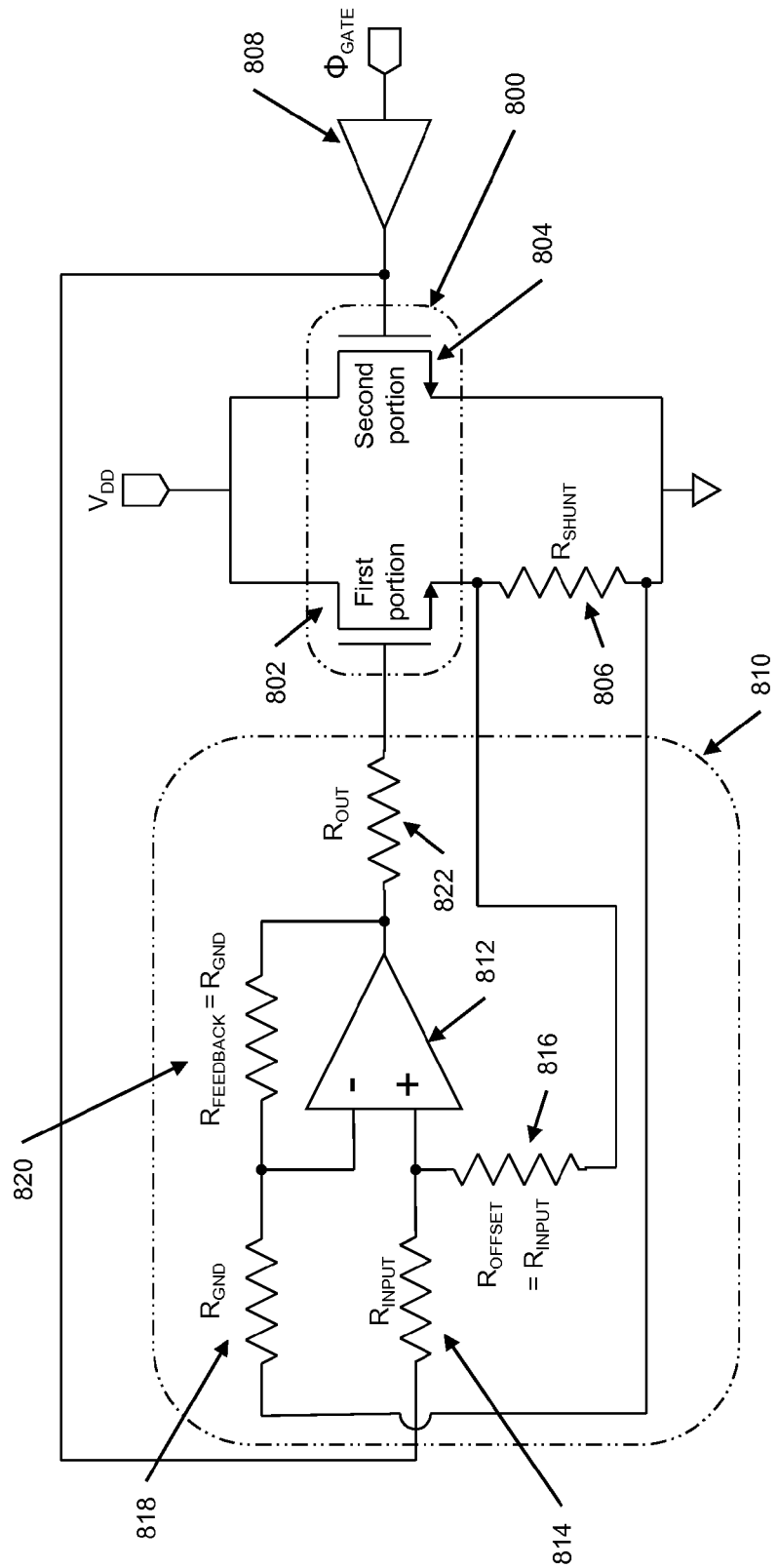
FIG. 8 and FIG. 9 depict compensation circuits to provide equivalent gate-source biases to a first gate segment and a second gate segment of a power transistor module with an n-channel MOS power transistor in a source-down configuration.
Figure 9:
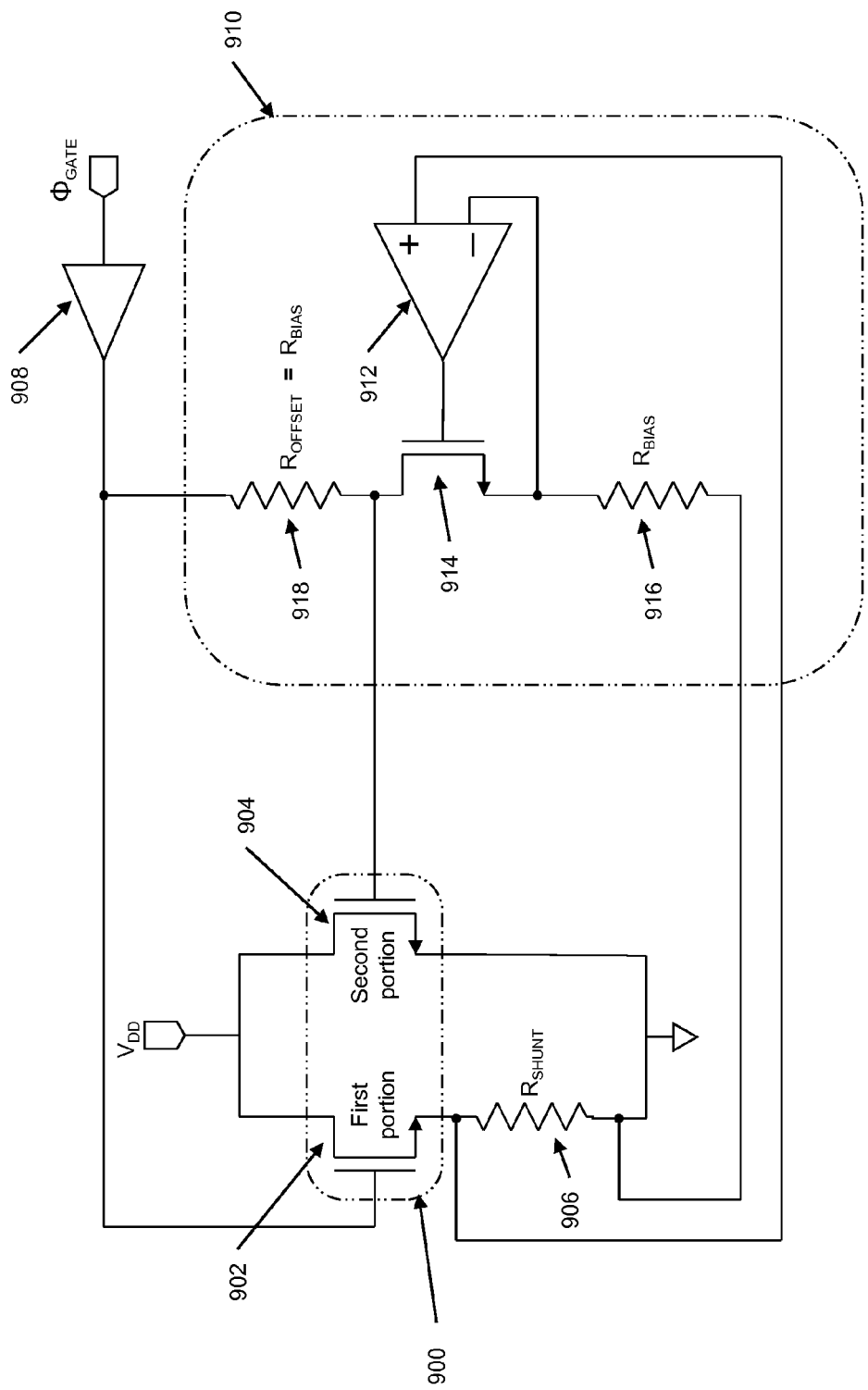

FIG. 8 and FIG. 9 depict compensation circuits to provide equivalent gate-source biases to a first gate segment and a second gate segment of a power transistor module with an n-channel MOS power transistor in a source-down configuration, formed according to any of the embodiments described in reference to FIG. 1 through FIG. 6, FIG. 7A and FIG. 7B. Referring to FIG. 8, a power transistor 800 has a first portion 802 and a second portion 804. A first terminus of a shunt 806 is coupled to a source node of the first transistor portion 802. Drain nodes of the first transistor portion 802 and second transistor portion 804 are coupled to a power node, labeled $V_{DD}$. A source node of the second transistor portion 804 and a second terminus of the shunt 806 are coupled to a ground node.

A gate signal, labeled $\Phi_{GATE}$, is coupled to an input of a gate buffer 808. An output of the gate buffer 808 is coupled to a gate node of a second gate segment of the second transistor portion 804. The output of the gate buffer 808 is also coupled to a first portion gate compensation circuit 810. The first portion gate compensation circuit 810 includes an amplifier 812. The output of the gate buffer 808 is coupled to a non-inverting input of the amplifier 812 through an input resistor $R_{INPUT}$ 814 of the first portion gate compensation circuit 810. The first terminus of the shunt 806 is coupled to the non-inverting input of the amplifier 812 through an offset resistor $R_{OFFSET}$ 816 of the first portion gate compensation circuit 810 which has a resistance equal to $R_{INPUT}$ 814. The second terminus of the shunt 806 is coupled to an inverting input of the amplifier 812 through a grounding resistor $R_{GND}$ 818 of the first portion gate compensation circuit 810. An output of the amplifier 812 is coupled to the inverting input of the amplifier 812 through a feedback resistor $R_{FEEDBACK}$ 820 of the first portion gate compensation circuit 810 which has a resistance equal to $R_{GND}$ 818. The output of the amplifier 812 is coupled to a gate node of a first gate segment of the first transistor portion 802, possibly through an optional output resistor $R_{OUTPUT}$ 822 of the first portion gate compensation circuit 810.

The first portion gate compensation circuit 810 may advantageous provide a same gate-source bias to the first transistor portion 802 as is provided to the second transistor portion 804. It will be recognized that operation of the gate signal $\Phi_{GATE}$ at voltage levels of $V_{DD}$ will require a voltage supply to the amplifier 812 above $V_{DD}$. The first portion gate compensation circuit 810 may be contained in a controller of the power transistor module containing the power transistor 800.

Referring to FIG. 9, a power transistor 900 has a first portion 902 and a second portion 904. A first terminus of a shunt 906 is coupled to a source node of the first transistor portion 902. Drain nodes of the first transistor portion 902 and second transistor portion 904 are coupled to a power node, labeled $V_{DD}$. A source node of the second transistor portion 904 and a second terminus of the shunt 906 are coupled to a ground node.

A gate signal, labeled $\Phi_{GATE}$, is coupled to an input of a gate buffer 908. An output of the gate buffer 908 is coupled to a gate node of a first gate segment of the first transistor portion 902. The output of the gate buffer 908 is also coupled to a second portion gate compensation circuit 910. The first portion gate compensation circuit 810 includes an amplifier 812. An out put of the amplifier 912 is coupled to a gate of an re-channel current limiting MOS transistor 914. A source node of the current limiting MOS transistor 914 is coupled to a first terminus of a bias resistor $R_{BIAS}$ 916. A second terminus of the bias resistor $R_{BIAS}$ 916 is coupled to the second terminus of the shunt 906. A drain node of the current limiting MOS transistor 914 is coupled to a first terminus of an offset resistor $R_{OFFSET}$ 918 which has a resistance equal to $R_{BIAS}$ 916. A second terminus of the offset resistor $R_{OFFSET}$ 918 is coupled to the output of the gate buffer 908. The first terminus of the bias resistor $R_{BIAS}$ 916 is coupled to an inverting input of the amplifier 912. The first terminus of the shunt 906 is coupled to a non-inverting input of the amplifier 912. The first terminus of the offset resistor $R_{OFFSET}$ 918 is coupled to a gate node of a second gate segment of the second transistor portion 904.

The second portion gate compensation circuit 910 may advantageous provide a same gate-source bias to the second transistor portion 904 as is provided to the first transistor portion 902. It will be recognized that operation of the gate signal $\Phi_{GATE}$ at voltage levels of $V_{DD}$ may not necessarily require a voltage supply to the amplifier 912 above $V_{DD}$. The second portion gate compensation circuit 910 may be contained in a controller of the power transistor module containing the power transistor 900.

Figure 10:
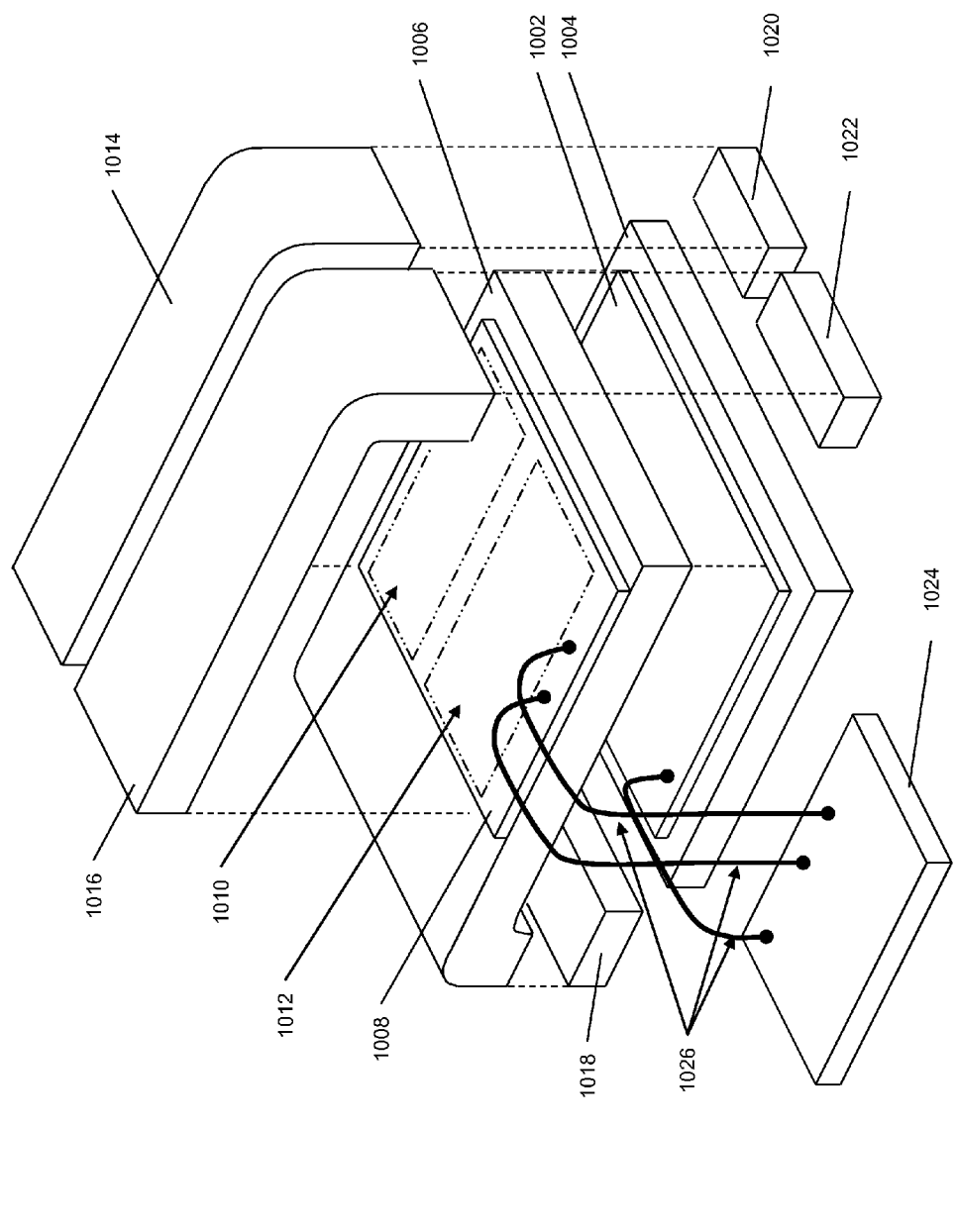
FIG. 10 is a perspective view of a power transistor module containing two power transistors in a stacked configuration.

FIG. 10 is a perspective view of a power transistor module containing two power transistors in a stacked configuration. The power transistor module 1000 includes a first power transistor 1002 attached to a transistor pad 1004. The transistor pad 1004 is electrically attached to a first power node of the first power transistor 1002. An intermediate clip 1006 is electrically attached to a second power node of the first power transistor 1002. A second power transistor 1008 has a first transistor portion 1010 and a second transistor portion 1012, as described in reference to FIG. 1. A common first power node, not shown, of the second power transistor 1008 is electrically attached to the intermediate clip 1006 opposite from the first power transistor 1002. A first clip 1014 is electrically attached to a first portion of a second power node of the second power transistor 1008 over the first transistor portion 1010, as described in reference to FIG. 1. A second clip 1016 is electrically attached to a second portion of the second power node of the second power transistor 1008 over the second transistor portion 1012, as described in reference to FIG. 1.

The intermediate clip 1006, the first clip 1014 and the second clip 1016 may be electrically connected to module pads 1018, 1020 and 1022 respectively. A controller 1024 may be electrically connected to a gate of the first power transistor 1002 and to a first gate and a second gate of the second power transistor 1008, for example through wirebonds 1026. The first gate of the second power transistor 1008 modulates current that flows through the first clip 1014, and the second gate modulates current that flows through the second clip 1016. A shunt may be directly electrically attached to the second power transistor 1008 in place of the first clip 1014, as described in reference to FIG. 4.

While various embodiments of the invention have been described above, it should be understood that they have been presented by way of example only and not limitation. Numerous changes to the disclosed embodiments can be made in accordance with the disclosure herein without departing from the spirit or scope of the invention. Thus, the breadth and scope of the invention should not be limited by any of the above described embodiments. Rather, the scope of the invention should be defined in accordance with the following claims and their equivalents.

What is claimed is:

1. A power transistor module, comprising:
a power transistor, including:
    a common first power node;
    a split control node with a first control segment and a second control segment; and
    a second power node, such that:
    said first control segment modulates current through a first portion of said power transistor, and said second control segment modulates current through a second portion of said power transistor, wherein a ratio of an area of said first transistor portion to a combined area of said first transistor portion and said second transistor portion is 5 percent to 75 percent;
a first clip, said first clip being electrically connected to said second power node over said first portion of said power transistor;
a second clip, said second clip being electrically connected to said second power node over said second portion of said power transistor; and
a shunt, said shunt being electrically connected in series with said first transistor portion.

2. The power transistor module of claim 1, in which said first control segment is coupled to a circuit which compensates a control bias at said first control segment for a voltage drop across said shunt.

3. The power transistor module of claim 1, in which said second control segment is coupled to a circuit which compensates a control bias at said second control segment for a voltage drop across said shunt.

4. The power transistor module of claim 1, in which said second power node is split into a first segment and a second segment; such that:
    said first segment of said second power node is part of said first portion of said power transistor;
    said first segment of said second power node is aligned with said first control segment so that said current modulated by said first control segment is directed through said first segment of said second power node;
    said second segment of said second power node is part of said second portion of said power transistor; and
    said second segment of said second power node is aligned with said second control segment so that said current modulated by said second control segment is directed through said second segment of said second power node.

5. The power transistor module of claim 1, in which said second power node is common to said first portion of said power transistor and to said second portion of said power transistor.

6. The power transistor module of claim 1, in which said power transistor is a metal oxide semiconductor (MOS) transistor.

7. The power transistor module of claim 6, in which:
said power transistor is a vertical MOS transistor;
said first power node is a drain node;
said control node is a gate node;
said first control segment is a first gate segment; and
said second control segment is a second gate segment.

8. The power transistor module of claim 1, in which said power transistor is a bipolar transistor.

9. The power transistor module of claim 1, in which said power transistor is formed on single crystal silicon.

10. The power transistor module of claim 1, in which said power transistor is formed on gallium nitride.

11. The power transistor module of claim 1, in which said shunt is a transistor of a same type as said power transistor.

12. The power transistor module of claim 1, in which:
said power transistor is an MOS transistor;
said control node is a gate which includes a plurality of separate gate elements;
said first control segment is a first gate segment which includes at least one of said gate elements;
said second control segment is a second gate segment which includes at least one of said gate elements;
said first clip is electrically connected to said second power node over said gate elements of said first gate segment;
said second clip is electrically connected to said second power node over said gate elements of said second gate segment;
said gate elements of said first gate segment are electrically connected to a first control circuit; and
said gate elements of said second gate segment are electrically connected to a second control circuit.

13. The power transistor module of claim 1, in which said first power node is attached and electrically connected to an electrically conductive transistor pad.

14. The power transistor module of claim 1, in which:
said first power node of said power transistor is electrically attached to an intermediate clip;
said intermediate clip is electrically attached to a second power node of a second power transistor; and
a first power node of said second power transistor is electrically attached to an electrically conductive transistor pad.

15. The power transistor module of claim 1, including a controller, said controller being wirebonded to said shunt.

16. The power transistor module of claim 1, including a controller, said controller being wirebonded to said first control segment and to said second control segment.

17. A power transistor module, comprising:
a power transistor, including:
a common first power node;
a split control node with a first control segment and a second control segment; and
a second power node, such that:
said first control segment modulates current through a first portion of said power transistor, and said second control segment modulates current through a second portion of said power transistor, wherein a ratio of an area of said first transistor portion to a combined area of said first transistor portion and said second transistor portion is 5 percent to 75 percent;
a shunt, said shunt being electrically connected to said second power node over said first portion of said power transistor; and
a second clip, said second clip being electrically connected to said second power node over said second portion of said power transistor.

18. The power transistor module of claim 17, in which said first control segment is coupled to a circuit which compensates a control bias at said first control segment for a voltage drop across said shunt.

19. The power transistor module of claim 17, in which said second control segment is coupled to a circuit which compensates a control bias at said second control segment for a voltage drop across said shunt.

20. The power transistor module of claim 17, in which said power transistor is an MOS transistor.

* * * * *